United States Patent
Fukuda et al.

[11] Patent Number: 5,985,022
[45] Date of Patent: Nov. 16, 1999

[54] OPTOELECTRIC ARTICLES AND A PROCESS FOR PRODUCING THE SAME

[75] Inventors: Tsuguo Fukuda, Sendai; Tatsuo Kawaguchi; Minoru Imaeda, both of Nagoya, all of Japan

[73] Assignee: NGK Insulators, Ltd., Japan

[21] Appl. No.: 08/807,363

[22] Filed: Feb. 27, 1997

Related U.S. Application Data

[62] Division of application No. 08/402,361, Mar. 13, 1995, Pat. No. 5,643,688.

[30]     Foreign Application Priority Data

Mar. 25, 1994 [JP] Japan .................................. 6-055613

[51] Int. Cl.⁶ ........................................................ C30B 1/00
[52] U.S. Cl. .................................. 117/11; 117/19; 117/35
[58] Field of Search .................................. 117/11, 19, 35

[56]     References Cited

U.S. PATENT DOCUMENTS

| | | | |
|---|---|---|---|
| 5,209,917 | 5/1993 | Ohno | 423/592 |
| 5,310,448 | 5/1994 | Bordui | 423/593 |
| 5,643,688 | 7/1997 | Fukuda | 428/699 |

FOREIGN PATENT DOCUMENTS

| | | |
|---|---|---|
| 515682 | 12/1992 | European Pat. Off. . |
| 5-117096 | 5/1993 | Japan . |

OTHER PUBLICATIONS

"Optical Waveguide of LiNbO3 Thin Film Grown by Liquid Phase Epitaxy", Applied Phys. Letters, vol. 26, No. 1, Jan. 1, 1975, by Miyazawa et al.

"Liquid Phase Epitaxial Growth of LiNbO3 Thin Film Using Li2O–B2O3 Flux System", Journ. of Crystal Growth 132 (1993), by Yamada et al.

Patent Abstracts of Japan, vol. 17, No. 475 (C–1103) [6104], Aug. 30, 1993.

*Primary Examiner*—Timothy M. Speer
*Attorney, Agent, or Firm*—Wall Marjama Bililnski & Burr

[57]     ABSTRACT

Optoelectric article includes a substrate made of an optoelectric single crystal and a film of a single crystal of lithium niobate formed on the substrate by a liquid phase epitaxial process, wherein a ratio of lithium/niobium of a composition of the film of the lithium niobate single crystal falls in a range of 48.6/51.4 to 49.5 to 50.5 or 50.5/49.5 to 52.3/47.7.

13 Claims, 5 Drawing Sheets

FIG_1

OPTOELECTRIC ARTICLES AND A PROCESS FOR PRODUCING THE SAME

This is a Division of application Ser. No. 08/402,361 filed Mar. 13, 1995, now U.S. Pat. No. 5,643,688.

BACKGROUND OF THE INVENTION (1) Field of the Invention

The present invention relates to optoelectric articles and a process for producing the same.

(2) Related Art Statement

The lithium niobate ($LiNbO_3$) single crystals and the lithium tantalate ($LiTaO_3$) single crystals have been expected as materials for optoelectronics. It is known that a thin film of lithium niobate may be formed on a substrate made of a single crystal of lithium niobate or the like by the liquid phase epitaxial process.

For example, according to the description in "Appln. Phys. Letters", vol. 26, No. 1 (1975), pp 8–10, a thin film of a single crystal of lithium niobate having an almost stoichiometric composition (Li/Nb=1) is formed on a substrate of a single crystal of lithium tantalate by the liquid phase epitaxial process. According to "J. Appln. Phys.", Vol. 70, No. 5 (1991), pp 2536–2541, a thin film of a single crystal of lithium niobate is formed on a substrate of lithium niobate doped with 5 mol % magnesium oxide by the liquid phase epitaxial process, while the ratio of $Li_2O/Nb_2O_5$ of a melt is varied and the lattice constant is varied. According to "J. Cryst. Growth", Vol. 132 (1993), pp 48–60, a thin film of a single crystal of lithium niobate having an almost stoichiometric composition is formed on a substrate of lithium niobate doped with 5 mol % magnesium oxide by the liquid epitaxial process. In unexamined Japanese patent application Laid-open No. 5-117096, a thin film of a single crystal of lithium niobate having a composition of Li/Nb=1 is formed by the liquid phase epitaxial process.

Single crystal substrates made of lithium niobate, which have been widely used in optical devices, etc., are now produced by the pull-up process (Czochralski process: CZ process), and their compositions have a congruent composition of Li/Nb=48.6/51.4. Single crystals of lithium niobate having compositions other than the congruent composition Li/Nb=48.6/51.4 are difficult to produce by the pull-up process, and crystalline substrates excellent enough to withstand optical applications have not been produced.

However, since the lattice constant of the single crystal films of lithium niobate formed on the single crystal substrates by the liquid phase epitaxial process differs from that of the substrate having the congruent composition. Lattice mismatch occurs at the interface between the film and the substrate, accordingly, it is difficult to form a thin film having excellent crystallinity on the substrate.

Further, the single crystals of lithium niobate have been used as substrates for optical devices. In this case, an optical waveguide is formed in the substrate by, for example, a proton-exchanging process. In such a proton-exchanging process, lithium atoms of the lithium niobate single crystal film are partially replaced by hydrogen atoms to form a layer made of $H_xLi-nNbO_3$ and having a high refractive index according to the following reaction: $LiNbO_3 + xH \rightarrow H_xLi-xNbO_3 + xLi$.

The present inventors formed a single crystal film of lithium niobate on a single crystal substrate by the liquid phase epitaxial process, and formed a proton-exchanged layer by using the resulting substrate. Then, the inventors examined the crystallinity of the proton-exchanged layer in detail. As a result, it was clarified that the crystallinity of the layer was deteriorated after replacement with the protons. It is believed that since lithium atoms are removed from the crystalline lattice of the single crystal film of lithium niobate, and instead replaced by hydrogen atoms, the crystalline lattice is distored during this step.

SUMMARY OF THE INVENTION

The present invention therefore to provides an optoelectric article in which a single crystal film of lithium niobate is formed on a substrate made of an optoelectric single crystal by the liquid phase epitaxial process, said single crystal film preventing incoherent lattice at an interface between a substrate having a congruent composition and the single crystal film of lithium niobate, being thin and having excellent crystallinity.

Another object of the present invention is to allow an optoelectric article in which a single crystal film of lithium niobate is formed on a substrate of an optoelectric single crystal and which enables an optical waveguide to have excellent crystallinity when such an optical waveguide is formed in the single crystal film of lithium niobate.

A further object of the present invention is to provide a process for producing such an optoelectric article as mentioned above.

According to a first aspect of the optoelectric article of the present invention, the single crystal film of lithium niobate is formed on the optoelectric single crystal substrate by the liquid phase epitaxial process, wherein the ratio of lithium to niobium in the composition of the single crystal film of lithium niobate is in a range of 48.6/51.4 to 49.5/50.5.

Further, according to second aspect of the optoelectric article of the present invention, the single crystal film of lithium niobate is formed on the optoelectric single crystal substrate by the liquid phase epitaxial process, wherein the ratio of lithium to niobium in the composition of the single crystal film of lithium niobate is in a range of 50.5/49.5 to 52.3/47.7.

According to the third aspect of the invention, there is provided a process for producing a comprising a substrate made of an optoelectric single crystal and a film of a single crystal of lithium niobate formed on the substrate by a liquid phase epitaxial process, wherein a ratio of lithium/niobium of a composition of the film of the lithium niobate single crystal falls in a range of 48.6/51.4 to 49.5/50.5 or in a range of 50.5/49.5 to 52.3/47.7, said process comprising the steps of mixing lithium niobate with a melting medium, melting the mixture at a temperature higher than a saturation temperature of lithium niobate in said melting medium, cooling the resulting melt to a solid phase-precipitating temperature which is lower than said saturation temperature and in which a solid phase is precipitated and coexists with a liquid phase, cooling the liquid phase and the solid phase to a temperature which is lower than said solid phase-precipitating temperature and in which the liquid phase is supercooled, and forming a film of the single crystal of lithium niobate on the substrate.

The following are preferred embodiments of the first and second aspects of the invention.

(1) A half-value width of a X-ray rocking curve of the film of the lithium niobate single crystal is smaller than that of the optoelectric single crystal substrate.

(2) The single crystal substrate is made of at least one single crystal selected from the group consisting of a single crystal of lithium niobate, lithium tantalate and $LiNb_xTa_{1-x}O_3$.

(3) The single crystal substrate is made of at least one single crystal selected from the group consisting of a single crystal of lithium niobate, lithium tantalate and $LiNb_xTa_{1-x}O_3$.

As to the first aspect of the invention, the ratio of lithium to niobium of a composition of the film of the lithium niobate single crystal is preferably not less than 49.0 mol %.

As to the second aspect of the invention, the ratio of lithium to niobium of a composition of the film of the lithium niobate single crystal is preferably not more than 52.3 mol %.

As to the third aspect of the invention, the following are preferred.
(1) $LiVO_3$ is used as the melting medium, and a ratio of lithium niobate ($LiNbO_3$) to $LiVO_3$ is 10 mol %/90 mol % to 60 mol %/40 mol %.
(2) The ratio of lithium to niobium of a composition of the film of the lithium niobate single crystal is not less than 52.3 mol %.
(3) The single crystal substrate is made of at least one single crystal selected from the group consisting of a single crystal of lithium niobate, lithium tantalate and $LiNb_xTa_{1-x}O_3$.

Heretofore, when the single crystal film of lithium niobate is to be produced by the liquid phase epitaxial process, only the films having the stoichiometric composition have been produced. And, there was only a recognition that the single crystal film of lithium niobate having the stoichiometric composition would be produced. However, the present inventors examined the relationship between the composition of the single crystal film produced by the liquid phase epitaxial process and the film-forming temperature in detail as mentioned later, and confirmed that single crystal films of lithium niobate having various compositions can be produced by finely controlling the film-forming temperature.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

For a better understanding of the invention reference is made to the attached drawings, wherein.

DETAILED DESCRIPTION OF THE INVENTION

Figure 4:
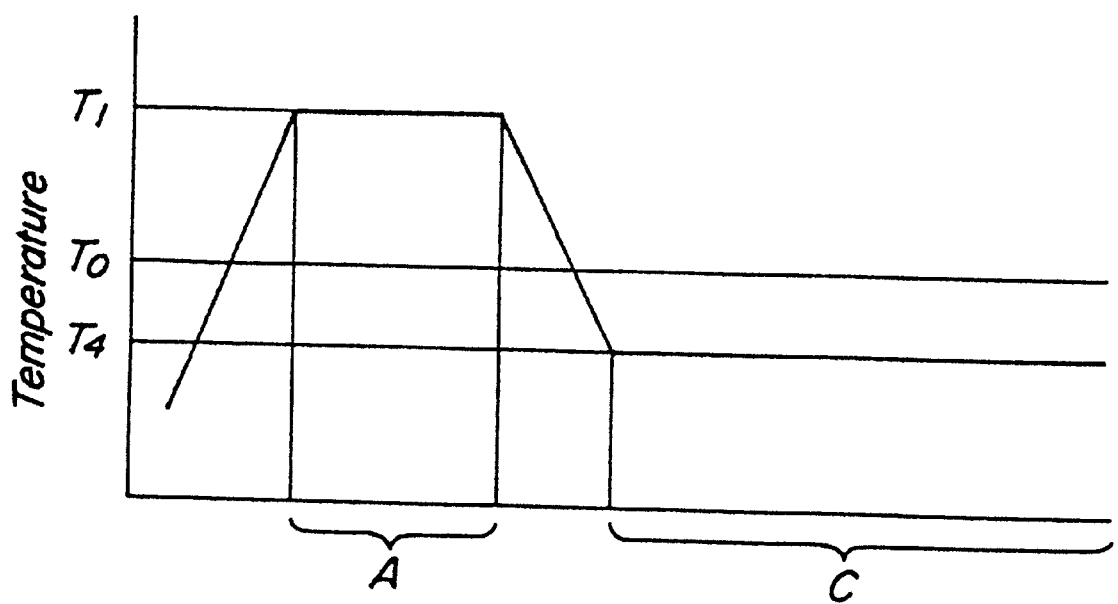
FIG. 4 is a graph schematically showing the temperature schedule of the melt in the liquid phase epitaxial process.
Figure 5:
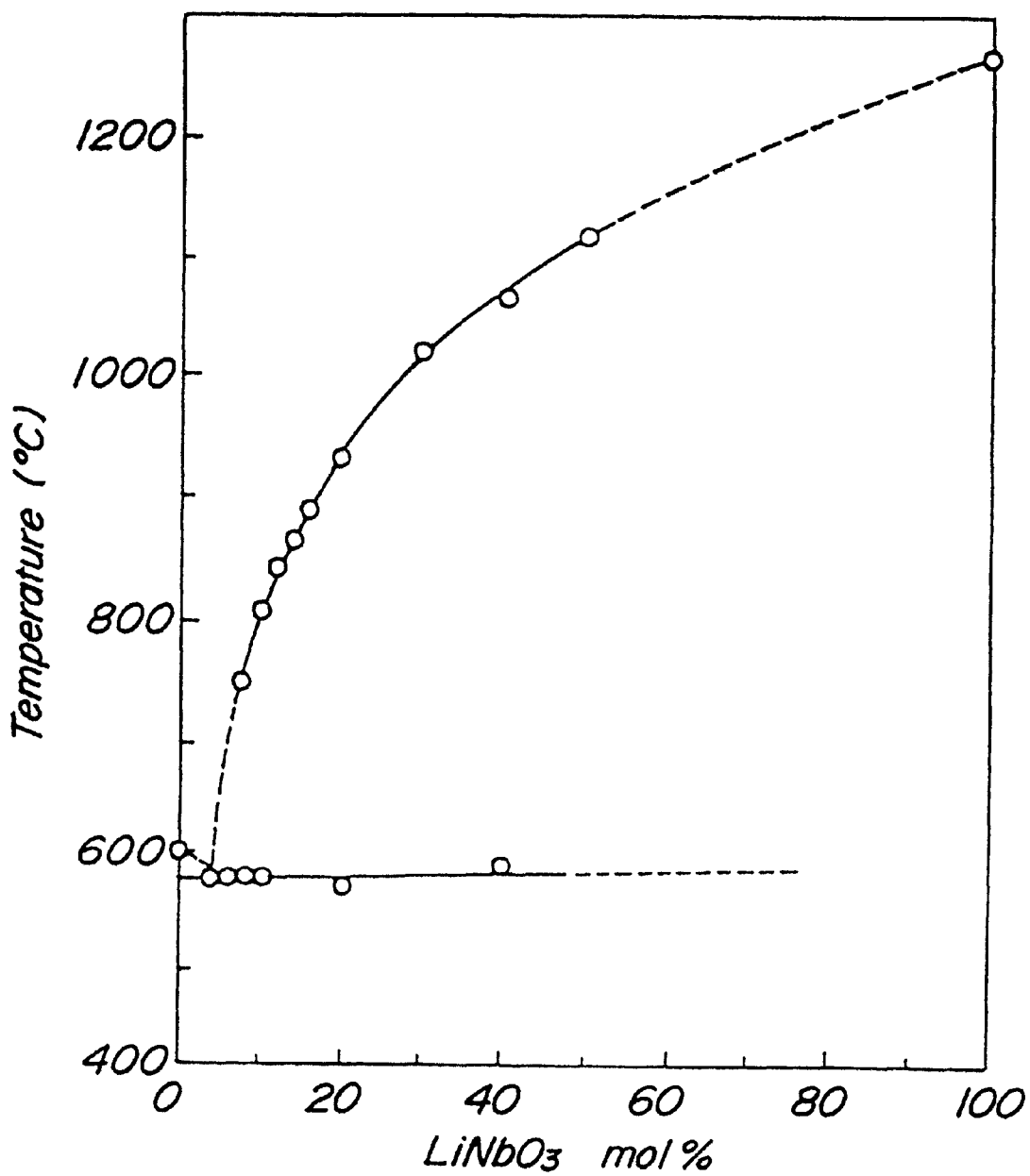
FIG. 5 is a graph schematically showing the solubility curve of a $LiNbO_3$—$LiVO_3$ pseudo-binary system.

First, the film-forming method in the liquid phase epitaxial process will be explained. FIG. 4 is a graph schematically illustrating a temperature schedule for a melt in case of the liquid phase epitaxial process. FIG. 5 is a graph showing a solubility curve of a pseudo-binary system such as $LiNbO_3$—$LiVO_3$. First, lithium niobate (solute) and $LiVO_3$ (melting media) are charged and mixed together. A saturated temperature corresponding to a melt having a charged composition is taken as "To". While the temperature of the melt is held at $T_1$ higher than the saturation temperature To, lithium niobate and $LiVO_3$ are uniformly melted. In FIG. 4, "A" corresponds to this molten state. Then, the melt is led to a supercooled state by lowering the temperature of the melt to a temperature $T_4$ lower than the saturation temperature To. In FIG. 4, "c" corresponds to this supercooled state. The substrate is contacted with the supercooled melt.

However, it is seen from FIG. 5 that as the concentration of $LiNbO_3$ (solute) increases, the saturation temperature increases and approaches the growing temperature in the pull-up process. Therefore, in order to form a film having excellent crystallinity, it is necessary to form the film at as low a temperature as possible. From this point of view, it is preferable to form the film at not more than 1000° C.

However, on the other hand, if the concentration of $LiNbO_3$ decreases and particularly if the saturation temperature becomes not more than 1000° C., the slope of the liquid phase line becomes very great. Therefore, even if the concentration of the solute in the melt slightly changes, the saturation temperature largely varies. In the liquid phase epitaxial process, the melt is kept at not less than the saturation temperature, and the film is formed in the supercooled state in which the film-forming temperature is lowered to be below saturation temperature. The crystallinity of the film is determined by the above supercooled state, and this supercooled state is determined by the saturation temperature and the film-forming temperature. Therefore, if the concentration of the solute in the melt slightly changes, it becomes impossible to form the film having excellent crystallinity. Particularly, if a film is repeatedly formed on the substrate during the actual film-forming process, the composition of the melt changes with high response. Consequently, it is difficult to keep the concentration of the solute constant. Therefore, it is difficult to form films with high reproducibility.

In particularly, the reproducibility becomes poor, with deteriorated crystallinity contrary to the expectation, in a film-forming range of not more than 1000° C. in which the single crystal film having excellent crystallinity must be inherently formed.

For the above reasons, it was formerly difficult to finely control the saturation temperature and the film-forming temperature. The films have been usually formed in a range of 900 to 950° C. As to the composition of the single crystal films, it has been considered that the films having the almost stoichiometric composition would be produced.

In order to solve such difficulties in investigation, the inventors first examined the sequences of the liquid phase epitaxial process again. The supercooled state has been conventionally realized by fully melting the solute and the melting media at a sufficiently high temperature of 1000–1300° C., and setting the temperature of the melt at lower than the saturation temperature corresponding to the charged composition. That is, it was a common knowledge that it was necessary to attain the supercooled state from the liquid phase at a sufficiently high temperature.

Figure 2:
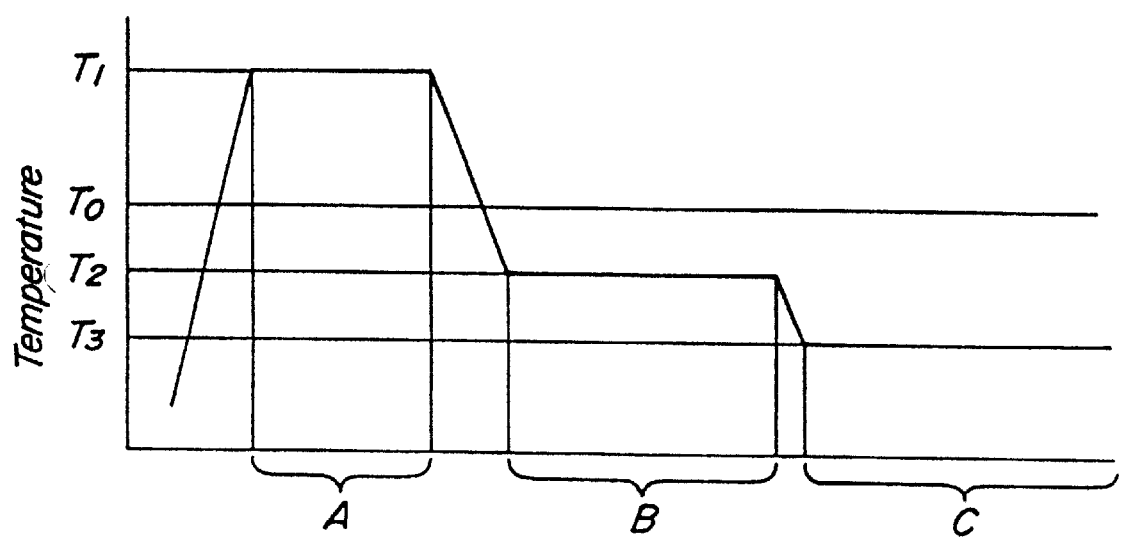
FIG. 2 is a graph schematically showing the temperature schedule of the melt adopted by the present inventors so as to finely control the film-forming temperature over the wide temperature range.
Figure 3A:
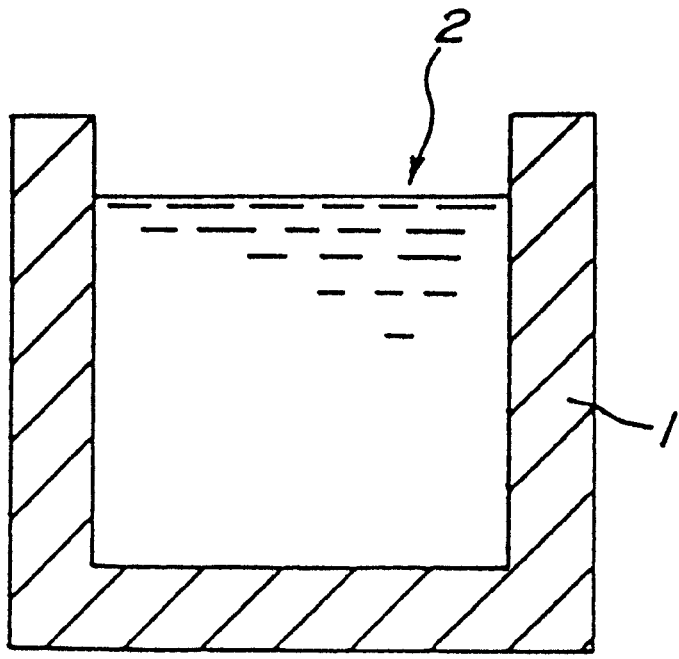
FIGS. 3(a) and 3(b) are sectional views schematically illustrating the state of the melt in the crucible 1.
Figure 3B:
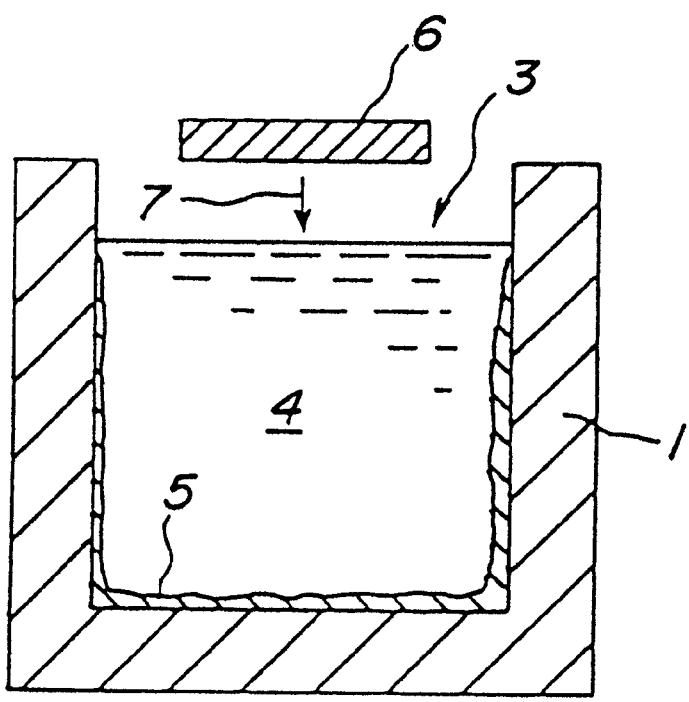

Having noted this point, the present inventors developed a process essentially different from the conventional ones. FIG. 2 is a graph schematically showing the temperature schedule of the melt in the liquid phase epitaxial process. FIGS. 3(a) and 3(b) schematically show the state of the melt in a crucible 1.

First, a solute and a melting medium are charged and mixed in the crucible 1. The saturation temperature To of the melt is one-to-one determined by the concentration of the solute in the melt, that is, corresponding to the charged composition. This saturation temperature can be calculated, for example, from a liquid phase curve as shown in FIG. 5.

Then, while the temperature of the melt is kept at $T_1$ higher than the saturation temperature To, the solute and the melting medium are uniformly melted. In FIG. 2, "A" corresponds to the molten state. As shown in FIG. 3(a), the mixture is entirely in the form of a liquid phase.

Next, the temperature of the melt is lowered to a solid phase-precipitating temperature $T_2$ lower than the saturation temperature To. In this state, the melt is first kept in an supercooled state. When the melt is kept at that temperature $T_2$ for a sufficiently long time, a solid phase comes out from the melt. In FIG. 2, "B" corresponds to a state in which the melt is kept for the precipitation of the solid phase. As shown in FIG. 3(b), at that time, the melt 3 is separated into a liquid phase 4 and a solid phase 5. The solid phase 5 precipitates along a wall surface of the crucible 1.

Thereafter, the temperature of the melt is lowered to convert the liquid phase 4 to the supercooled state. In FIG. 2, "C" corresponds to this supercooled state. The substrate 6 is lowered toward the liquid phase 4 in the supercooled state as shown by an arrow 7, and contacted with the liquid phase 4, thereby epitaxially growing a film of a single crystal on the substrate.

In this way, according to the process of the present invention, the state B in which the solid phase and the liquid phase stably co-exist is taken as a starting point. That is, the temperature $T_2$ is taken as a starting point, and the liquid phase is converted to the supercooled state by lowering the temperature in the state B to the temperature $T_3$. In this way, in the state in which the solid phase and the liquid phase coexist, the concentration of the solute in the liquid phase is kept at the saturated concentration at the holding temperature $T_2$ so long as the temperature exceeds the saturated temperature of the whole system.

For example, if the concentration of the solute in the melt decreases, the amount of the solid phase decreases at the holding temperature $T_2$, corresponding to this decreased concentration. On the other hand, if the concentration of the solute increases, the solid phase increases corresponding to the increased concentration of the solute. Therefore, the relationship between the temperature of the liquid phase and the concentration of the solute is always kept constant. Since the film-forming temperature $T_3$ is as a matter of course kept constant, the difference between $T_2$ and $T_3$ (degree of supercooling) is kept constant. Consequently, the super-cooled state is completely controlled.

As a result, even if the composition of the melt changes due to repeated formation of the films onto the substrates during the actual film-forming process, the supercooled state can be almost completely kept constant. Therefore, the film of the single crystal having excellent crystallinity can be produced with high reproducibility.

According to this process, the relationship between the saturation temperature and the film-forming temperature can be finely controlled. In addition, in the process of the present invention, as shown in FIG. 3(b), the solid phase 5 preliminarily coexists in the melt 3 before the substrate 6 contacts the melt 3. In this state, melting and precipitation simultaneously occur at the interface between the solid phase 5 and the liquid phase 4 as viewed microscopically. Therefore, when a fresh substrate 6 is contacted with the melt 3, a film begins to be smoothly grown to produce a single crystal film having excellent crystallinity.

The present inventors adopted the above process, and observed how the composition of the film of the single crystal of lithium niobate changed corresponding to various film-forming temperatures, while such film-forming temperatures were finely controlled.

In a $LiNbO_3$—$LiVO_3$ pseudo-binary system, a charged composition of a melt was set at 40 mol % $LiNbO_3$—60 mol % $LiVO_3$, and the liquid phase epitaxial process was effected along the temperature schedule in FIG. 2. Each melt 2 was stirred at a sufficiently high temperature $T_1$ (1000° C.–1300° C.) for not less than 3 hours to attain a sufficiently uniform liquid state.

Figure 1:
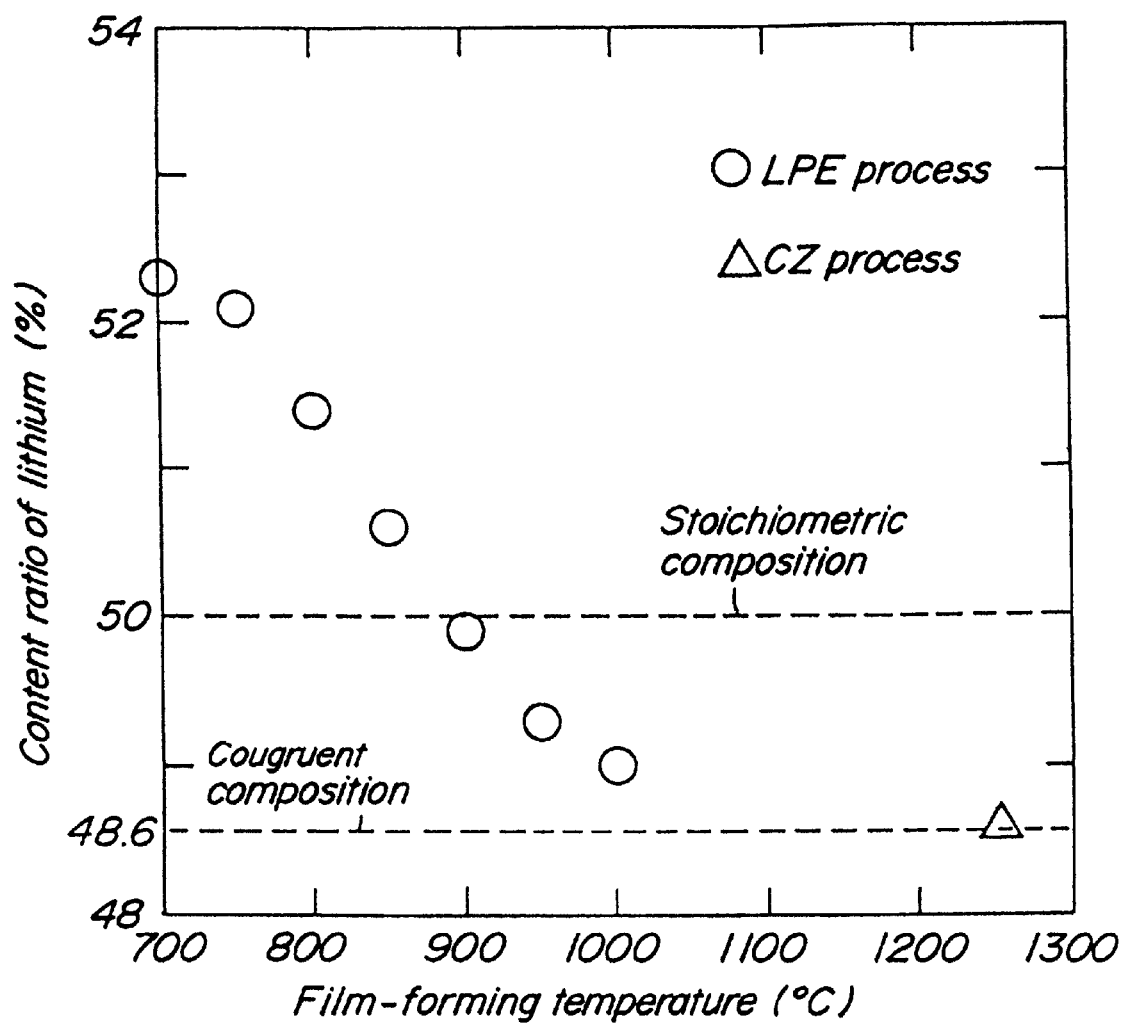
FIG. 1 is a graph showing the relationship between the film-forming temperature and the composition of the film of the single crystal of lithium niobate when the film-forming temperature is finely controlled over a wide temperature range in the formation of the single crystal film of lithium niobate by the liquid phase epitaxial process.

Thereafter, after the melt was cooled to the holding temperature $T_2$, the melt was held at this temperature for not less than 12 hours until nuclei of lithium niobate corresponding to an oversaturated amount were formed and the solid phase 5 precipitated. The liquid phase 4 in the melt was in the saturated state at the temperature $T_2$, and the liquid phase 4 and the solid phase 5 of lithium niobate coexisted in the melt 3. Then, the melt 3 was cooled from $T_2$ to the film-forming temperature lower than the supercooled temperature $T_2$ by 5° C. Immediately after that, a single crystal substrate 6 of lithium niobate was contacted with the melt to produce a film. The composition of the single crystal film was measured by the following method. Results are shown in FIG. 1 and Table 1.

The compositions of the films thus formed were determined by measuring a Curie temperature through a differential thermal analysis or by measuring a phase matching temperature of a second-harmonic generation with use of a laser beam having a wavelength of 1064 nm.

TABLE 1

| Film-forming temperature | Content of Lithium (mol %) |
| --- | --- |
| 1,250° C. CZ process | 48.6 |
| 1,000° C. (film-forming temperature) | 49.0 |
| 950° C. (film-forming temperature) | 49.3 |
| 900° C. (film-forming temperature) | 49.9 |
| 850° C. (film-forming temperature) | 50.6 |
| 800° C. (film-forming temperature) | 51.4 |
| 750° C. (film-forming temperature) | 52.1 |
| 700° C. (film-forming temperature) | 52.3 |

As is seen from the results, different from the conventional common knowledge, it was clarified that the composition of the single crystal film of lithium niobate can be varied and controlled in a range between the congruent composition (Li/Nb=48.6/51.4) and the content of lithium being about 52 mol % by varying the film-forming temperature.

Having put forward the investigation based on this knowledge, the present inventors discovered that when the composition of the single crystal film of lithium niobate is set to have the content of lithium being not more than 49.5 mol %, the incoherent lattice at the interface between the substrate having the congruent composition and the single crystal film of lithium niobate can be prevented, and the thin film of the single crystal having excellent crystallinity can be offered.

Particularly, it is preferable that a half-value width in a X-ray rocking curve of the single crystal film of lithium niobium is smaller than that of the single crystal substrate having an optical grade. If the content of lithium is more than 49.5 mol %, it may possibly cause the mismatch of the lattice at the interface. As a result, since the crystalline state is largely disturbed near the interface due to the incoherent lattice, the half-value width of the film is likely to increase.

In view of this, in order to make the above half-value width of the single crystal film of lithium niobium smaller than that of the single crystal substrate, it is necessary to largely increase the thickness of the single crystal film of lithium niobium, so that a thin film having excellent crystallinity cannot be obtained.

The temperature range of $T_0$ in FIG. 2, in which the single crystal film of lithium niobium having the composition with the content of lithium being 49.5 to 48.6 mol % can be formed, is 930° C.–1250° C. As shown in FIG. 1, the higher the film-forming temperature, the content of lithium approaches the congruent composition. If the film-forming temperature exceeds 1000° C., it becomes difficult to form the single crystal film having excellent crystallinity. Therefore, in order to form the single crystal film of lithium niobate having a half-value width smaller than that of the single crystal substrate having the optical grade, it is preferable to set the content ratio of lithium to not less than 49.0%.

Further, it is preferable that the thickness of the single crystal film of lithium niobate is set at 5–50 $\mu$m. If the content lithium was not more than 49.5 mol %, it was possible to form the single crystal film of lithium niobate having the half-value width smaller than that of the optical grade single crystal substrate even if the thickness of the film is not more than 5 $\mu$m.

Next, in the case of the optoelectric article in which the composition of the single crystal film of lithium niobate was set at the content ratio of lithium being not less than 50.5 mol %, the single crystal film of lithium niobate having a half-value width smaller than that of the optical grade single crystal substrate could be formed. In addition, an optical waveguide was formed in a portion of the single crystal film of lithium niobate by the proton-replacing process, and a half-value width of the proton-replaced optical waveguide was measured. As a result, it was discovered that the half-value width of the optical waveguide was conspicuously reduced as compared with conventional cases.

The reason for this is not clear. It is probably considered that since the content ratio of lithium atoms is relatively large, influence upon the crystal lattice is small when the lithium atoms in the single crystal of lithium niobate are replaced by hydrogen atoms.

The temperature range in which the film of the single crystal having a composition with the content ratio of lithium being 50.5–52.3 mol % can be formed is 700° C. to 850° C. As shown in FIG. 1, the lower the film-forming temperature, the higher is the content ratio of lithium. If the film-forming temperature is less than 700° C., it becomes difficult to form the single crystal film having excellent crystallinity. Therefore, in order to form the single crystal film of lithium niobate having the half-value width smaller that of the optical grade single crystal substrate, it is preferable that the content ratio of lithium is not more than 52.3 mol %.

Now, the half-value width of the X-ray rocking curve will be explained. The crystallinity of the single crystal substrate and the single crystal film can be evaluated by their half-value widths of the X-ray rocking curve. In general, it can be considered that the smaller the half-value width, the more excellent the crystallinity of the single crystal. Since this value itself varies depending upon a standard crystal etc. used in the X-ray measuring apparatus, an absolute value cannot be identified.

However, the crystallinity of the single crystal thin film produced by the liquid phase epitaxial process is strongly influenced by that of the single crystal substrate. Therefore, whether the crystallinity of the single crystal film produced is excellent must be judged with reference to the half-value width of the X-ray rocking curve of the substrate used. Particularly, since the single crystal substrate having the optical grade is produced presently by the pull-up process, it is preferable that the half-value width of the X-ray rocking curve of the single crystal film is smaller than that of the optical grade single crystal substrate.

PREFERRED EMBODIMENTS OF THE INVENTION

It is preferable to form the optoelectric single crystal substrate from one or more kinds of single crystals selected from a single crystal of lithium niobate ($LiNbO_3$), a single crystal of lithium tantalate ($LiTaO_3$) and a single crystal containing Nb and Ta ($LiNb_xTa_{1-x}O$: 0<x<1). It is more preferable to form the optoelectric single crystal substrate from the single crystal of lithium niobate.

The melting medium is preferably one or more melting media selected from $LiVO_3$ and $LiBO_2$. If one or more of such melting media are used, it is preferable that the charged composition of the melt has a ratio of solute/melting medium being 10/90 to 60/40 in terms of "mol %".

If the rate of the solute is less than 10 mol %, as shown in FIG. 5, the slope of the liquid phase curve becomes so great in a phase diagram of a pseudo-binary component system of solute-melting medium that the concentration of the melt largely changes owing to the growth of the film. Accordingly, it becomes difficult to stably keep the film-forming condition. If the ratio of the solute is more than 60%, the saturation temperature increases. Accordingly, the film-forming temperature becomes too high, and it becomes difficult to produce the single crystal film having excellent crystallinity.

(Experiments)

In the following, specific experimental results will be explained.

(Experiment 1)

A film of a single crystal of lithium niobate having a composition shown in Table 2 was formed on a substrate of a single crystal of lithium niobate by the above-mentioned producing process. A half-value width of an X-ray rocking curve of each of the single crystal substrates of lithium niobate having an optical grade used by the inventor was 6.8 to 6.9 (arc sec), and these substrates were taken as standards for crystallinity of the single crystal substrate of lithium niobate.

With respect to the single crystal films of lithium niobate having the compositions shown in FIG. 2, their film thicknesses were varied, and their half-value widths of the X-ray rocking curve were measured.

The half-value width was measured with use of reflection at a (0012) face by a double-crystal method. A CuKα1 line was used as an incident X-ray, and a (422) face of a GaAs single crystal was used as a monochrometer.

The half-value width of each of the single crystal films of lithium niobate was compared with that (6.8–6.9 arc sec) of the single crystal substrate of lithium niobate. There was a tendency that the larger the thickness of the single crystal film of lithium niobate, the smaller the half-value width. With respect to the compositions, the minimum thickness of the single crystal film which gave rise to a half-value width smaller than that (6.8–6.9 arc sec) of the single crystal substrate of lithium niobate having the optical grade. Results are shown in Table 2.

TABLE 2

| Content of Lithium (mol %) | Lithium Thickness of single crystal film ($\mu$m) |
|---|---|
| 48.8 | 10 |
| 49.0 | 5 |
| 49.3 | 5 |
| 49.5 | 6 |
| 49.7 | 18 |
| 50.0 | 24 |
| 50.3 | 30 |
| 51.0 | 40 |
| 51.5 | 45 |

As is seen from Table 2, when the content ratio of lithium was not more than 49.5 mol %, the single crystal film of lithium niobate having the half-value width smaller than that of the lithium niobate single crystal substrate having the optical grade could be obtained, though the thickness of the film was not more than 10 $\mu$m. However, if the content ratio of lithium was more than 49.5 mol %, the minimum thickness of the film rapidly increased.

It is seen that the content ratio of lithium is more preferably 49.0 to 49.5 mol % in that excellent crystallinity of the film is kept.

(Experiment 2)

A film of a single crystal of lithium niobate having a composition shown in Table 3 was formed on a substrate of a single crystal of lithium niobate by the above-mentioned producing process. A half-value width of X-ray rocking curves of each of the single crystal substrates of lithium niobate having an optical grade used by the inventor was 6.8 to 6.9 (arc sec), and these substrates were taken as a standard for crystallinity of the single crystal substrate of lithium niobate.

The substrate having, on the surface, the single crystal film of lithium niobate having the composition shown in Table 3 was produced. Then, this single crystal substrate was washed with acetone, isopropyl alcohol, and pure water under application of ultrasonic waves. Then, the substrate was immersed into a melt of a benzoic acid, and subjected to a proton replacement reaction at 195° C. for 20 minutes. The substrate was extracted from the melt, it was washed with acetone, isopropyl alcohol, and pure water under application of ultrasonic waves. Thereafter, the substrate was annealed to form an optical waveguide.

The half-value width of the X-ray rocking curve of the proton-exchanged optical waveguide in each run was measured by the above-mentioned method. Measurement results are shown in Table 3.

TABLE 3

| Content of Lithium (mol%) | Half width of single crystal film (arc · sec) |
|---|---|
| 49.5 | 18.4 |
| 50.0 | 9.6 |
| 50.3 | 7.2 |
| 50.5 | 6.1 |

TABLE 3-continued

| Content of Lithium (mol%) | Half width of single crystal film (arc · sec) |
|---|---|
| 50.7 | 5.9 |
| 51.0 | 5.8 |
| 51.3 | 5.7 |
| 51.7 | 5.8 |
| 52.1 | 6.0 |

As is seen from Table 3, when the content ratio of lithium was not less than 50.5 mol %, the optical waveguide-provided optoelectric article in which the half-value width of the single crystal film was smaller than that of the single crystal substrate of lithium niobate having the optical grade could be obtained. However, when the content ratio was less than 50.5 mol %, the above half-value width of the film rapidly increased.

It is seen that the content of lithium is more preferably set at 51.0–52.0 mol % in that crystallinity of the proton-exchanged optical waveguide can be kept excellent.

As mentioned above, the present invention is directed to the optoelectric article in which the single crystal film of lithium niobate is formed on the optoelectric single crystal substrate by the liquid phase epitaxial process, and is characterized in that the single crystal film which prevents incoherent lattice at the interface between the substrate having the congruent composition and the single crystal film of lithium niobate, is thin, and has excellent crystallinity can be obtained.

Further, the present invention is directed to the optoelectric article in which the single crystal film of lithium niobate is formed on the optoelectric single crystal substrate by the liquid phase epitaxial process, and is characterized in that when the optical waveguide is formed at a portion of the single crystal film of lithium niobate, the optical waveguide has excellent crystallinity.

What is claimed is:

1. A process for producing an optoelectric article including an optoelectric single crystal substrate and a lithium niobate single crystal film formed on the substrate by a liquid phase epitaxial process, wherein a lithium/niobium ratio in the film ranges from 48.6/51.4 to 49.5/50.5 or from 50.5/49.5 to 52.3/47.7, said process comprising the steps of:

mixing lithium niobate with a melting medium;

melting the mixture at a temperature higher than a saturation temperature of lithium niobate in said melting medium;

cooling the resulting melt to a solid phase-precipitating temperature which is lower than said saturation temperature and in which a solid phase is precipitated and coexists with a liquid phase;

maintaining the solid/liquid phase mixture substantially at said solid phase-precipitating temperature to precipitate the solid phase;

cooling the solid/liquid phase mixture to a temperature which is lower than said solid phase-precipitating temperature and in which the liquid phase is supercooled; and forming a film of single crystal lithium niobate on the substrate.

2. The process of claim 1, wherein $LiVO_3$ is used as the melting medium, and a ratio of $LiNbO_3$ to $LiVO_3$ is 10 mol %/90 mol % to 60 mol %/40 mol %.

3. The process of claim 2, wherein said lithium/niobium ratio is not less than 52.3 mol %.

4. The process of claim 2, wherein the single crystal substrate comprises at least one single crystal selected from the group consisting of lithium niobate, lithium tantalate and $LiNb_xTa_{1-x}O_3$.

5. The process of claim 2, wherein said saturation temperature is 930° C. to 1250° C. when said lithium/niobium ratio is 48.5/51.4 to 49.5/50.5.

6. The process of claim 2, wherein the thickness of the film is 5 to 50 μm when said lithium/niobium ratio is 48.5/51.4 to 49.5/50.5.

7. The process of claim 2, wherein said saturation temperature is 700° C. to 850° C. when said lithium/niobium ratio is 50.5/49.5 to 52.3/47.7.

8. The process of claim 1, wherein said lithium/niobium ratio is not less than 52.3 mol %.

9. The process of claim 8, wherein the single crystal substrate comprises at least one single crystal selected from the group consisting of lithium niobate, lithium tantalate and $LiNb_xTa_{1-x}O_3$.

10. The process of claim 1, wherein the single crystal substrate comprises at least one single crystal selected from the group consisting of lithium niobate, lithium tantalate and $LiNb_xTa_{1-x}O_3$.

11. The process of claim 1, wherein said saturation temperature is 930° C. to 1250° C. when said lithium/niobium ratio is 48.5/51.4 to 49.5/50.5.

12. The process of claim 1, wherein the thickness of the film is 5 to 50 μm when said lithium/niobium ratio is 48.5/51.4 to 49.5/50.5.

13. The process of claim 1, wherein said saturation temperature is 700° C. to 850° C. when said lithium/niobium ratio is 50.5/49.5 to 52.3/47.7.

* * * * *